(12) United States Patent
Chopra et al.

(10) Patent No.: US 10,899,940 B2
(45) Date of Patent: Jan. 26, 2021

(54) INTERLAYER PRINTING PROCESS

(71) Applicant: Xerox Corporation, Norwalk, CT (US)

(72) Inventors: Naveen Chopra, Oakville (CA); Chad Smithson, Toronto (CA); Kurt Halfyard, Mississauga (CA); Gail Song, Milton (CA); Michelle Chretien, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 328 days.

(21) Appl. No.: 15/414,814

(22) Filed: Jan. 25, 2017

(65) Prior Publication Data

US 2018/0208785 A1    Jul. 26, 2018

(51) Int. Cl.
| | | |
|---|---|---|
| *C09D 11/102* | (2014.01) |
| *C09D 11/52* | (2014.01) |
| *C09D 11/037* | (2014.01) |
| *B22F 3/10* | (2006.01) |
| *B22F 3/24* | (2006.01) |
| *B22F 5/00* | (2006.01) |

(Continued)

(52) U.S. Cl.
CPC .......... *C09D 11/102* (2013.01); *B22F 3/1021* (2013.01); *B22F 3/24* (2013.01); *B22F 5/00* (2013.01); *B22F 7/008* (2013.01); *B22F 7/04* (2013.01); *B29C 64/112* (2017.08); *B33Y 10/00* (2014.12); *B33Y 30/00* (2014.12); *C09D 11/037* (2013.01); *C09D 11/52* (2013.01); *H05K 1/092* (2013.01); *H05K 3/386* (2013.01); *H05K 3/4664* (2013.01); *B22F 2003/248* (2013.01); *B22F 2007/047* (2013.01); *B22F 2301/255* (2013.01); *B22F 2302/45* (2013.01); *B22F 2303/40* (2013.01); *B22F 2998/10* (2013.01); *H05K 1/0284* (2013.01); *H05K 1/097* (2013.01); *H05K 3/1241* (2013.01); *H05K 2201/09845* (2013.01); *H05K 2203/0502* (2013.01)

(58) Field of Classification Search
CPC .............................. C09D 11/102; B33Y 10/00
USPC .............................................................. 419/5
See application file for complete search history.

(56) References Cited

U.S. PATENT DOCUMENTS

| | | | |
|---|---|---|---|
| 7,864,542 B2 | 1/2011 | Inagaki et al. | |
| 2002/0051921 A1* | 5/2002 | Morita | ..................... G03G 5/05 |
| | | | 430/78 |

(Continued)

FOREIGN PATENT DOCUMENTS

EP    3355668 A1    8/2018

OTHER PUBLICATIONS

CA Patent Application No. 2,992,226 Office Action dated Oct. 25, 2018, 5 pages.

(Continued)

*Primary Examiner* — Weiping Zhu
(74) *Attorney, Agent, or Firm* — Hoffman Warnick LLC

(57) ABSTRACT

Disclosed herein as a printing method and system which includes providing a substrate and depositing an interlayer composition including a polymer selected from the group of epoxy resins, polyvinyl phenols and poly(melamine-co-formaldehyde) and an interlayer composition solvent on the substrate. The interlayer composition is cured to form cured interlayer. A conductive metal ink composition is deposited on the cured interlayer and the conductive metal ink composition is cured to form a solid metal trace on the cured interlayer.

12 Claims, 5 Drawing Sheets

(51) Int. Cl.
*B22F 7/00* (2006.01)
*B22F 7/04* (2006.01)
*B33Y 10/00* (2015.01)
*B33Y 30/00* (2015.01)
*H05K 3/46* (2006.01)
*H05K 1/09* (2006.01)
*H05K 3/38* (2006.01)
*B29C 64/112* (2017.01)
*H05K 3/12* (2006.01)
*H05K 1/02* (2006.01)

(56) References Cited

U.S. PATENT DOCUMENTS

2009/0212292 A1* 8/2009 Hayton ............... H01L 51/0023
257/66
2011/0111588 A1 5/2011 Nishi
2012/0168211 A1* 7/2012 Lu ......................... H05K 3/386
174/257
2015/0270488 A1* 9/2015 Akiyama ............ H01L 51/0022
257/40
2016/0204494 A1 7/2016 Pykari et al.
2018/0208785 A1 7/2018 Chopra et al.

OTHER PUBLICATIONS

European Search Report for EP Application No. 18151219.5-1202, dated May 25, 2018, 9 pages.
CA Office Action and Search Report and corresponding CA Patent Application No. 2992226 dated Oct. 16, 2019, 6 pages.

\* cited by examiner

INTERLAYER PRINTING PROCESS

BACKGROUND

Field of Use

The present invention relates to a multi-layer printing process. More particularly, the disclosure herein provides a method of an improved process for manufacturing printed circuits on flat and 3-dimensional (3D) surfaces.

Background

Solution processable conducting materials such as silver nanoparticle inks play an important role in electronic device integrations. Metal nanoparticle inks can be easily dispersed in suitable solvents and used to fabricate various conducting features in electronic devices such as electrodes and electrical interconnects by low-cost solution deposition and patterning techniques such as inkjet, aerosol, flexo and gravure printing techniques.

Flexible printed electronics are enabled by printing and annealing of silver nanoparticle inks on flexible substrates such as PET (polyethylene terephthalate) and polyimide. However, many silver nanoparticle inks suffer from poor adhesion on such substrates, which limits the opportunities for robust device fabrication. Addition of polymeric materials directly to the conductive ink is usually not possible, as this results in decreased conductivity of the final conductive metal trace that is formed. It would be desirable to have processes that improve conductive ink adhesion and enable formation of printed electronic devices with robust mechanical properties without sacrificing electric conductivity.

SUMMARY

According to an embodiment, there is provided a printing method which includes providing a substrate and depositing an interlayer composition including a polymer selected from the group of epoxy resins, polyvinyl phenols and poly(melamine-co-formaldehyde) and an interlayer composition solvent on the substrate. The interlayer composition is cured to form cured interlayer. A conductive metal ink composition is deposited on the cured interlayer and the conductive metal ink composition is cured to form a solid metal trace on the cured interlayer.

According to an embodiment, there is provided a printing system. The printing system includes an interlayer printer system that deposits an interlayer composition a polymer selected from the group of epoxy resins, polyvinyl phenols and poly(melamine-co-formaldehyde) and an interlayer composition solvent on a substrate. The printing system includes a heating system for curing the interlayer composition on a surface of the substrate to form a cured interlayer. The printing system includes a conductive ink printer system for depositing a conductive metal ink composition on the cured interlayer. The printing system includes a heater system for curing the conductive ink composition to form a trace on the cured interlayer.

According to another embodiment there is provided a printing method including depositing an interlayer composition including a polymer selected from the group of epoxy resins, polyvinyl phenols and poly(melamine-co-formaldehyde) and an interlayer composition solvent on a substrate. The printing method includes curing the interlayer composition to form a cured interlayer. A conductive metal ink composition is deposited on the cured interlayer. The conductive metal ink composition includes silver nanoparticles having a size of from about 0.5 to about 100 nm. The conductive metal ink composition to form a solid metal trace on the cured interlayer.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

Figure 1A:
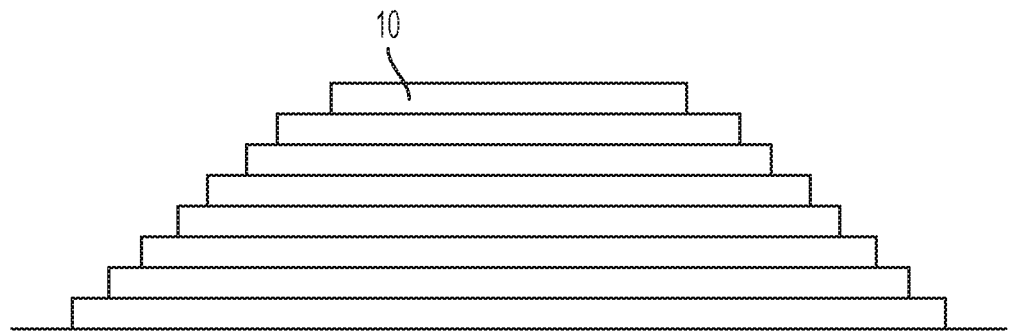
FIGS. 1 (*a*)-(*e*) illustrate processes in a method for printing according to embodiments of the invention.

It should be noted that some details of the FIGS. have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Illustrations with respect to one or more implementations, alterations and/or modifications can be made to the illustrated examples without departing from the spirit and scope of the appended claims. In addition, while a particular feature may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

Metal nanoparticle inks, including silver inks play an important role in electronic device integrations. One issue often encountered is poor adhesion. The sintered metal nanoparticle inks do not have good adhesion on certain substrates, especially glass. Previously, this adhesion issue was addressed by addition of small amount of polymeric materials in metal nanoparticle inks. The disadvantage of this approach is the sacrifice of electrical conductivity. Disclosed herein is an improved process for enhancing adhesion without sacrificing electrical conductivity of the metal nanoparticle inks used in electronic device applications.

Disclosed herein is a printing process for depositing a reactive thermally curable interlayer composition which improves the adhesion and can create a smooth surface between substrates and printed conductive ink.

Specifically, the disclosed process uses aerosol printing of a thermally curable interlayer composition. Additives can optionally be included in the interlayer composition to improve wetting and spreading properties. The interlayer can be fabricated by solution process methods including spin coating, dip coating, and inkjet printing etc. on various substrates, followed by heat treatment for curing. The interlayer provides good adhesion on a variety of substrates. Conductive features can be fabricated by solution processing techniques such as ink jet or aerosol printing onto the substrates with the applied and cured interlayer.

The process disclosed herein deposits an interlayer composition on a surface of a substrate prior to the coating the conductive ink. The substrate can be any article that can withstand the coating and curing process of the interlayer and conductive ink, for example articles produced by a 3D printer or a printed circuit. The interlayer provides improved adhesion of the conductive ink to the substrate. The interlayer lowers the surface roughness of the substrate that is being coated with conductive ink.

Many 3D printed parts have a roughened surface, by virtue of the printing process used to make the part. For example, FDM (fused deposition modelling) leaves signature 'corduroy' textured surfaces as a function of the layer-by-layer deposition of molten filament. MJM (multi-jet modelling) can have rough surfaces due to the co-printed support material which is later removed (usually by mechanical/thermal methods). This can leave a roughened interface. SLS (selective laser sintering) can also leave a pitted/roughened surface as well.

FDM uses thermoplastic materials such as polylactic acid (PLA), acrylonitrile butadiene styrene (ABS), nylon, polyetherimide and acrylonitrile styrene acrylate (ASA). FDM 3D printing uses filaments that are unwound from a coil and supplied to an extrusion nozzle. The flow is turned on and off to deposit the material in the proper place. The nozzle is heated to melt the material. The thermoplastics are heated past their glass transition temperature and are deposited by an extrusion head. The nozzle can be moved in both horizontal and vertical directions by a numerically controlled mechanism. The nozzle follows a tool-path controlled by a computer-aided manufacturing (CAM) software package, and the part is built from the bottom up, one layer at a time.

MJM is an inkjet printing process that uses piezo printhead technology to deposit either photocurable plastics layer by layer. Materials include UV curable materials such as acrylates and methacrylates.

SLS is an additive manufacturing technique that uses a high power laser to fuse small particles together. Material options include plastic, metal, ceramic, nylon, polystyrene or glass powder. In many cases, SLS does not require any support structures, as parts are surrounded by unsintered powder at all times.

By applying an interlayer composition to the surface of a substrate improvements in smoothness, adhesion and conductivity are achieved.

The interlayer composition can include epoxy resins, polyvinyl phenols and poly(melamine-co-formaldehyde). The poly(melamine-co-formaldehyde) can be methylated, butylated, isobutylated or acrylated. The interlayer composition may further contain small amounts of a surface levelling agent to control wetting and spreading properties of coating as well as catalyst for curing process.

The interlayer composition can optionally include a catalyst. Any suitable or desired catalyst can be selected for the present interlayer compositions. In embodiments, the catalyst is selected from the group consisting of amine salts of dodecylbenzene sulfonic acid (DDBSA), para toluene sulfonic acid, triflouromethane sulfonic acid, and combinations thereof.

The catalyst can be provided in the interlayer composition in any suitable or desired amount. In embodiments, the catalyst is present in an amount of from about 0.05 to about 1.5 percent, or from about 0.08 to about 1.0 percent, or from about 0.1 to about 0.5 percent, by weight, based on the total weight of the interlayer composition.

The interlayer composition includes a solvent. The solids content of the interlayer composition is from about 10 weight percent to about 50 weight percent, or from about 20 weight percent to about 40 weight percent or from about 30 weight percent to about 40 weight percent. Many solvents are suitable for the interlayer composition. The solvent can be a non-polar organic solvent selected from the group consisting of hydrocarbons such as alkanes, alkenes, alcohols having from about 7 to about 18 carbon atoms such as undecane, dodecane, tridecane, tetradecane, hexadecane, 1-undecanol, 2-undecanol, 3-undecanol, 4-undecanol, 5-undecanol, 6-undecanol, 1-dodecanol, 2-dodecanol, 3-dedecanol, 4-dedecanol, 5-dodecanol, 6-dodecanol, 1-tridecanol, 2-tridecanol, 3-tridecanol, 4-tridecanol, 5-tridecanol, 6-tridecanol, 7-tridecanol, 1-tetradecanol, 2-tetradecanol, 3-tetradecanol, 4-tetradecanol, 5-tetradecanol, 6-tetradecanol, 7-tetradecanol, and the like; alcohols such as terpineol (α-terpineol), β-terpineol, geraniol, cineol, cedral, linalool, 4-terpineol, 3,7-dimethylocta-2,6-dien-1ol, 2-(2-propyl)-5-methyl-cyclohexane-1-ol; isoparaffinic hydrocarbons such as isodecane, isododecane; commercially available mixtures of isoparaffins such as Isopar™ E, Isopar™ G, Isopar™ H, Isopar™ L, Isopar™ V, Isopar™ G, manufactured by Exxon Chemical Company; Shellsol® manufactured by Shell Chemical Company; Soltrol® manufactured by Chevron Phillips Chemical Company; Begasol® manufactured by Mobil Petroleum Co., Inc.; IP Solvent 2835 manufactured by Idemitsu Petrochemical CO., Ltd; naphthenic oils; aromatic solvents such as benzene, nitrobenzene, toluene, ortho-, meta-, and para-xylene, and mixtures thereof; 1,3,5-trimethylbenzene (mesitylene); 1,2-, 1,3-, and 1,4-dichlorobenzene and mixtures thereof, trichlorobenzene; cyanobenzene; phenylcyclohexane and tetralin; aliphatic solvents such as isooctane, nonane, decane, dodecane; cyclic aliphatic solvents such as dicyclohexyl and decalin; and mixtures and combinations thereof. In embodiments, two or more solvents can be used.

The solvent can be provided in the interlayer composition in any suitable or desired amount. In embodiments, the solvent is present in an amount of from about 50 to about 90 percent, or from about 60 to about 80 percent, or from about 70 to about 80 percent, by weight, based on the total weight of the interlayer composition.

The interlayer composition is stable and can be coated and cured at temperatures ranging from about 100° C. to about 180° C. Since epoxy resins are excellent electrical insulators, the electrical conductivity of metal nanoparticle inks will not be affected by this interlayer coating.

The interlayer solution is very stable and coating can be cured at low temperature. Since epoxy resins are excellent electrical insulators, the electrical conductivity of metal nanoparticle inks will not be affected by this interlayer coating.

The interlayer solution can be deposited by aerosol printing and then thermally cured. The interlayer composition can be deposited by solution processing methods including spin coating, dip coating, and inkjet printing etc. on various substrates and curing at suitable temperatures and times.

After application and curing of the interlayer, the conductive ink is applied to the cured interlayer.

The conductive inks may be made include dissolved or stabilized metal nanoparticles in a solvent. The conductive inks are deposited on the cured interlayer. The deposition of the conductive ink on a cured interlayer on the substrate is through any suitable printing technique, for example, aerosol printing, spin coating, dip coating and inkjet printing. In an aerosol printing process, an ultrasonic transducer device is used to create a fine aerosol mist of ink droplets that is pumped through a nozzle.

According to embodiments herein, the nanoparticles in the conductive inks may have diameter in the submicron range. Silver, gold and copper are suitable metals for the conductive inks. Silver nanoparticles sinter at 120° C. which is more than 800° C. below the melting temperature of bulk silver. Copper and gold nanoparticles have comparable melting points of between 100° C. and 140° C., whereas the melting temperatures for bulk gold or copper is in the range of 1060° C. to 1085° C. This lower melting point is a result of comparatively high surface-area-to-volume ratio in nanoparticles, which allows bonds to readily form between neighboring particles. The large reduction in sintering temperature for nanoparticles enables forming highly conductive traces or patterns on the interlayer, because the interlayer choice melt or soften at relatively low temperatures (for example, 150° C.). 20. The conductive metal ink composition is cured at a temperature of from about 100° C. to about 180° C.

In embodiments, the metal nanoparticles may be elemental silver, gold or copper, a alloys of silver gold or copper or combinations thereof. In embodiments, the metal nanoparticles may be a base material coated or plated with pure silver or a silver alloy. For example, the base material may be copper flakes with silver plating.

In embodiments, the silver may include either or both of (i) one or more other metals and (ii) one or more non-metals. Suitable other metals include, for example, Al, Au, Pt, Pd, Cu, Co, Cr, In, and Ni, particularly the transition metals, for example, Au, Pt, Pd, Cu, Cr, Ni, and mixtures thereof. Exemplary metal composites includes Au—Ag, Ag—Cu, Au—Ag—Cu, and Au—Ag—Pd. Suitable non-metals in the metal composite include, for example, Si, C, and Ge.

The nanoparticles for the conductive ink may have an average particle size, for example, from about 0.5 to about 100 nm, or from about 1.0 to about 50.0 microns, or from about 1.0 to about 20.0 microns.

The metal nanoparticles may be present in the conductive ink in an amount, for example, at least about 50 weight percent of the conductive ink, or from about 50 to about 90 weight percent of the conductive ink, or from about 55 to about 85 weight percent of the conductive ink.

The conductive ink may include a solvent(s). The solvent(s) may be used as a vehicle for dispersion of the metal nanoparticles to minimize or prevent the metal nanoparticles from agglomerating and/or optionally providing or enhancing the solubility or dispersiblity of metal nanoparticles.

In embodiments, a viscosity (less than 5 cps) and high metal loading (greater than 50 weight percent) are suitable for printing. Solvent(s) used in the conductive ink herein may have a viscosity equal to or less than about 1 cps. In addition, the solvent(s) can have good miscibility with the metal nanoparticles.

Any suitable solvent(s) having a viscosity equal to or less than about 1 cps may be used to dissolve or to disperse the silver nanoparticle for the ink herein. Examples of suitable solvents may include organic solvents, for example, a hydrocarbon, a heteroatom-containing aromatic compound, or an alcohol. Suitable organic solvent(s) herein may be, for example, decalin, bicyclohexyl, ethylcyclohexane, phenylcyclohexane, tetralin, cyclohexane, n-octane, toluene, m-xylene, o-xylene, p-xylene, mesitylene, isopar, heptane, isooctane, and trimethylbenzene. These types of solvents have very low viscosity property (equal to or less than about 1 cps) and good solubility for silver nanoparticles.

The solvent may be present in the conductive ink in an amount, for example, from about 2.0 to about 50.0 weight percent of the conductive ink, or from about 5.0 to about 40.0 weight percent of the conductive ink, or from about 10.0 to about 30.0 weight percent of the conductive ink.

Following printing of the nanoparticle ink on the interlayer, the ink is subjected to a curing step. The curing step removes substantially all of the solvent and the organic stabilizer, and the destabilized particles weld together (sinter) to form a continuous metal film that firmly adheres to the interlayer.

Figure 1B:
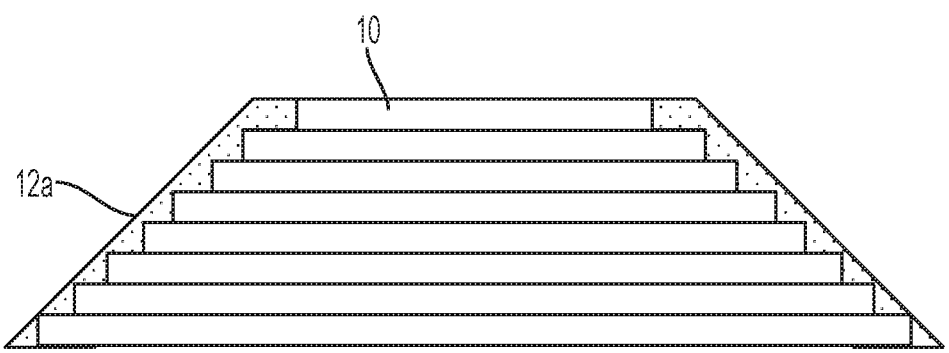
Figure 1C:
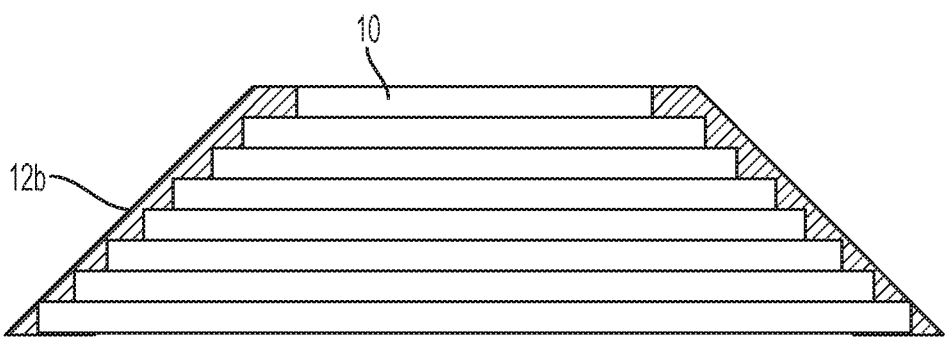
Figure 1D:
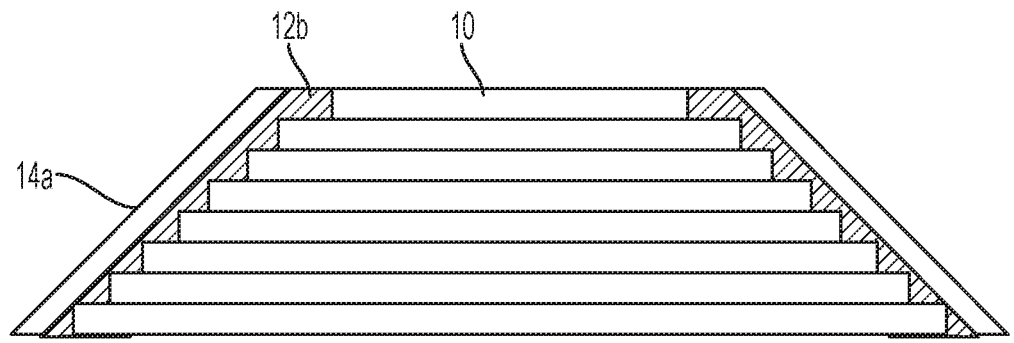
Figure 1E:
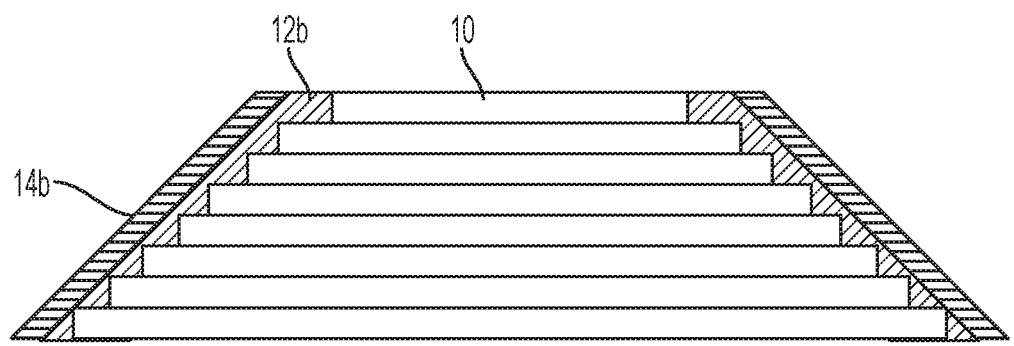

FIG. 1(a) through FIG. 1(e) depict the process disclosed herein. In FIG. 1(a), a substrate 10 is depicted. The substrate 10 is shown with ridges representing a roughened surface. In FIG. 1(b), an interlayer composition 12(a) is printed or deposited on the substrate 10. After deposition of the interlayer 12(a), there is heating step (FIG. 1(c) which thermally cures the interlayer composition 12(a) to form a cured interlayer 12(b). In FIG. 1(d) a conductive ink composition 14(a) is applied to the thermally cured interlayer 12(b) shown in FIG. 1(c). The part in FIG. 1(d) is then sintered to cure the conductive ink and form a solid metal trace or line 14(b) and is shown in FIG. 1(e).

The interlayer composition can include the following components. Poly(propylene glycol) diglycidyl ether (PPGDGE). The PPGDGE is available from Sigma Aldrich and has an average molecular weight number of from about 300 to about 700. Propylene glycol methyl ether acetate (PGMEA) is available from Sigma Aldrich. Poly(4-vinyl) phenol (PVP) also available from Sigma Aldrich and has an average molecular weight from 10,000 to 40,000. Poly (melamine co-formaldehyde), methylated 84 weight percent solution in 1-butanol (MMF) is available from Sigma Aldrich. BYK®-Silclean 3700 available from BYK. Silclean is a solution of OH-functional silicone modified polyacrylate. BYK®-Silclean 3700 is an optional ingredient in the interlayer composition. BYK® 3510 surfactant, also optional, can be added to the interlayer composition. The loading level of these surfactants is from about 0.05 weight percent to about 2 weight percent. The interlayer composition components are mixed to form a solution which are deposited on a substrate through aerosol printing. The interlayer solution in then cured in a by application of heat. The conductive ink is then applied and sintered to produce the final part.

Figure 2:
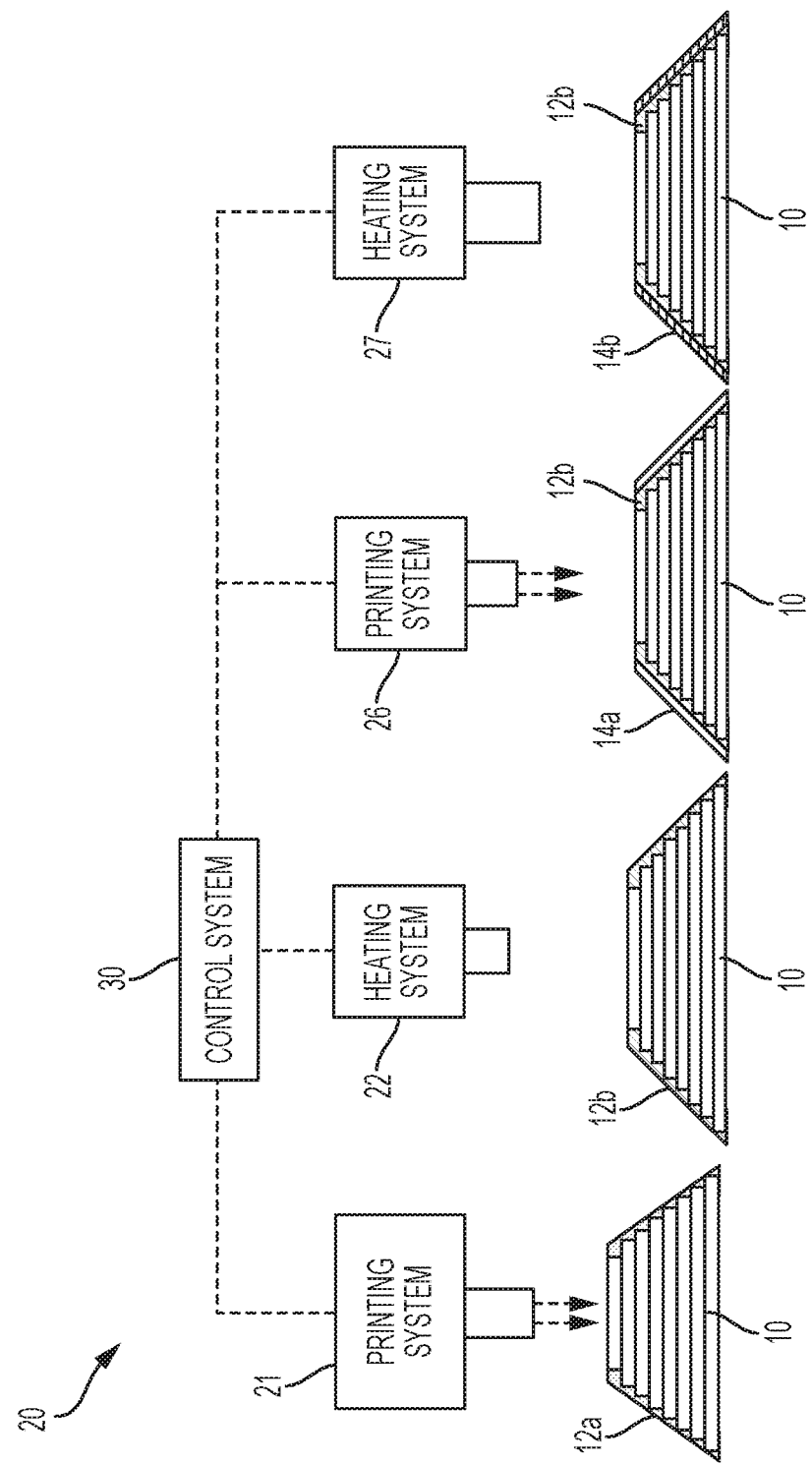
FIG. 2 shows a schematic depiction of a printing system for various embodiments disclosed herein.

FIG. 2 shows a schematic depiction of a system 20 for printing according to embodiments disclosed herein. As shown, the system 20 can include a printing system 21 programmed to deposit an interlayer composition 12(a) on a substrate 10. The substrate 10 can be any article that can withstand the coating and curing process of the interlayer and conductive ink, for example, articles produced by a 3D printer or a printed circuit. The printing system 21 can be an aerosol printer, ink jet printer, spin coating printer or dip coating printer.

The substrate 10, having the deposited interlayer composition 12(a) is then heated in a heating system 22 to the cured interlayer composition forming a solid interlayer 12(b). The heating system 22 can include an oven or a heated platen, such as a hotplate or a hot air gun.

The system 20 includes a printing system 26 for depositing an ink jet composition 14(a) on the cured interlayer 12(b). The printing system 26 can be an aerosol printer, ink jet printer, spin coating printer or dip coating printer. The printing system 21 and 26 can be a single printer having different supplies for the interlayer composition and the conductive ink composition.

The substrate 10 having the deposited conductive ink composition 14(a), is then heated in a heating system 27 to cure the conductive ink composition 14(b) forming a solid metal trace 14(b) on the cured interlayer 12(b). The heating system 27 can include an oven or a heated platen, such as a hotplate or a hot air gun. The heating systems 22 and 27 can be a single heating system.

In various embodiments, the system 2 can include a control system 30 coupled to the printing system 21, heating system 22, printing system 26 and/or the heating system 27. The control system 30 can be configured to provide instructions to, and/or otherwise control operation of the printing system 21, heating system 22, printing system 26 and/or the heating system 27. The control system 30 may be mechanically or electrically connected to the printing system 21, heating system 22, printing system 26 and/or the heating system 27. Control system 30 may be a computerized, mechanical, or electro-mechanical device capable of controlling the printing system 21, heating system 22, printing system 26 and/or the heating system 27. In one embodiment, control system 30 may be a computerized device capable of providing operating instructions to the printing system 21, heating system 22, printing system 26 and/or the heating system 27. In another embodiment, control system 30 may include a mechanical device, capable of use by an operator. In this case, the operator may physically manipulate control system 30 (e.g., by pulling a lever), which may actuate the printing system 21, heating system 22, printing system 26 and/or the heating system 27. In another embodiment, control system 30 may be an electro-mechanical device.

Figure 3:
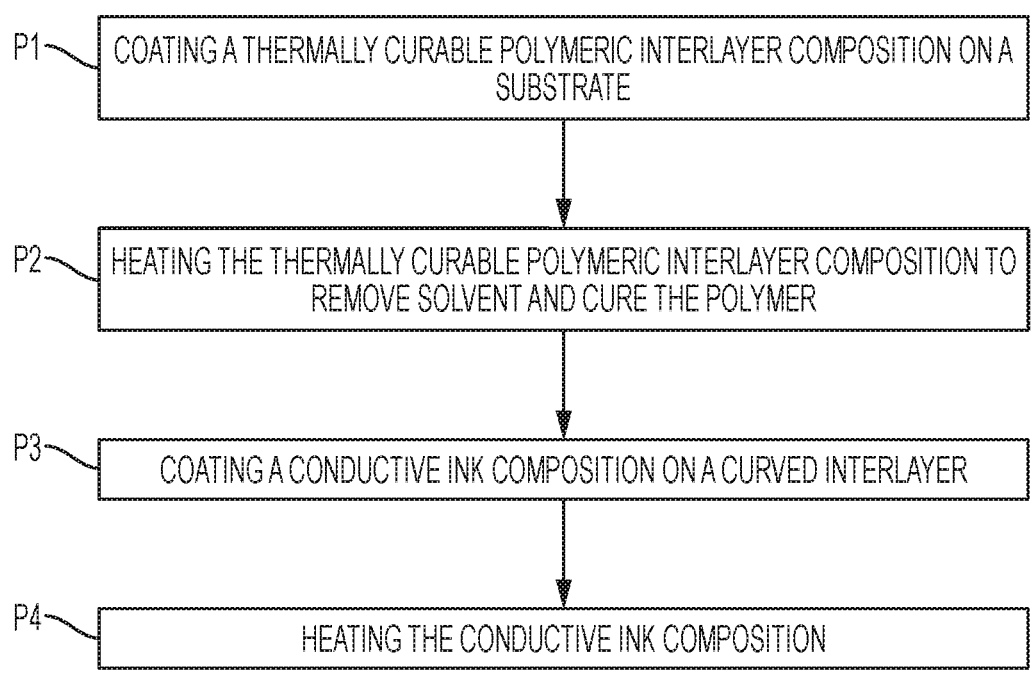
FIG. 3 shows a flow chart illustrating a method according to various embodiments disclosed herein.

FIG. 3 shows a flow chart illustrating a method performed according to various embodiments.

Process P1: An interlayer composition is coated on a substrate. The interlayer composition includes thermally curable polymer such as epoxy, polyvinyl phenol and poly (melamine-co-formaldehyde). The interlayer includes a solvent and an optional levelling agent or surfactant and a catalyst.

Process P2: The interlayer composition is cured by heating. The heating evaporates the solvents and cures the thermally curable polymer to form a smooth surface.

Process P3: A conductive ink composition is coated on the cured interlayer. The conductive ink composition includes metal nanoparticles and a solvent and an organic stabilizer.

Process P4: The conductive ink composition is heated to remove the solvent sinter the metal nanoparticles to form a solid trace on the cured interlayer.

EXAMPLES

A magnetic stir bar was added to a 120 mL amber glass bottle containing PGMEA solvent (63 g) was added. Gradual addition of PMMF (5.6 g) to the amber bottle while stirring at 250 RPM was commenced. The mixture was stirred at 250 RPM for 2 hours until the mixture was a clear solution.

A magnetic stir bar was added to a 250 mL amber glass bottle containing PGMEA solvent (63 g). While stirring the PGMEA solution at 250 RPM, PPGDGE polymer (52.8 g) was slowly added. This mixture was stirred for 2 hours at 250 RPM until all the PPGDGE was dissolved.

The 120 mL bottle containing PMMF/PGMEA was poured into the 250 mL bottle containing PLDGE/PGMEA, while stirring at 250 RPM. PVP (10 g) was slowly added to the mixture with stirring until the PVP was completely dissolved. The bottle was placed on a Movil-rod mixer to gently tumble and roll the final mixture overnight at 175 RPM. Finally, the solution was filtered through 0.2 micron filter paper to remove any suspended matter, resulting in a clear, colorless solution. Table 1 shows the weight percent of the components of the interlayer composition.

TABLE 1

| | Interlayer formulation composition | | | | | |
|---|---|---|---|---|---|---|
| Sample ID | PPGDGE Mn 389 (wt %) | PMMF (wt %) | PVP (wt %) | PGMEA Solvent (wt %) | % solids | TOTAL (wt %) |
| EXP-AA0736-37 | 26.45 | 5.60 | 4.95 | 63.00 | 37.00 | 100.00 |

The interlayer composition of Table 1 was deposited via aerosol jet printing using an Optomec Sprint System Aerosol jet printing uses nitrogen gas flowing through a specific probe geometry under pressure in a chamber (atomizer) to create aerosolized droplets containing solvent/particle mixtures which can then be focused and directed (using a sheath gas) through a small orifice (nozzle). This allows for non-contact printing by way of a fixed nozzle and moving stage. Deposition is controlled by a balance of atomizing nitrogen gas flow, focusing sheath gas and exhaust gas which regulates the vacuum source that removes un-focused streams of aerosol mixtures (typically larger atomized droplets). Print conditions for the interlayer composition included a nozzle size of 250 microns, a nozzle offset of 3 mm from the substrate and a line print speed of 10-25 mm/s. The nitrogen gas flow rates, in SCCM (standard cubic centimeters per minute) were: atomization nitrogen flow of 500 SCCM;

exhaust nitrogen flow of 500 SCCM; and sheath gas nitrogen flow of 150 SCCM. Printed samples were annealed in a convection oven at 120° C. for 2 hours. Two lines of interlayer were printed side by side with a small overlap to ensure a wide enough interlayer line for printing of a conductive ink. Each line had two passes of interlayer printed to increase the height of the line and eliminate pinholes.

Print conditions for the conductive ink included a nozzle size of 300 µm, nozzle offset of 3 mm, line print speed of 5-20 mm/s, an admix (bubbler) of ethylcyclohexane was used in line with the atomization gas flow. The conductive ink contained from about 50 to 70 weight percent stabilized silver nanoparticles, with a blend of ethylcyclohexane and phenylcyclohexane solvents. The nitrogen gas flow rates for the deposition of the conductive ink were: atomization nitrogen flow of 600-800 SCCM; exhaust nitrogen flow of 600-775 SCCM; and sheath gas nitrogen flow of 50-100 SCCM. Printed samples were left to stand at ambient temperature for 30 minutes then annealed at 130° C. in a convection oven for 1 hour.

Figure 4:
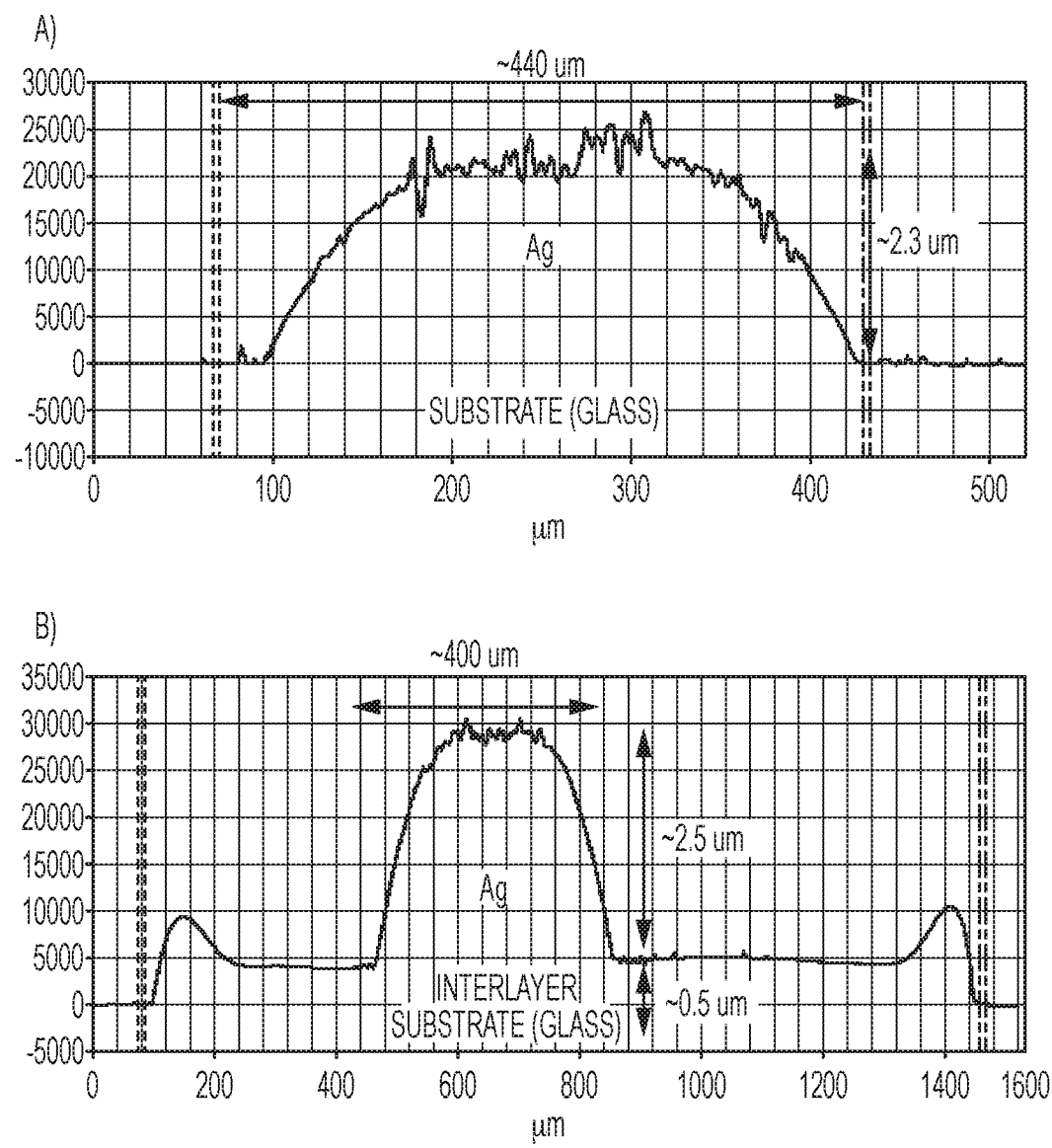
FIG. 4 illustrates the height and width profile of conductive line printer on an interlayer composition disclosed herein.

The printed ink on the interlayer showed less spreading and increased line height. The line height was about 2.5 microns on the interlayer. The interlayer thickness was about 0.5 microns. This is shown in FIG. 4. In FIG. 4, the interlayer is about 0.5 microns thick and is deposited on glass.

The printed lines shown in FIG. 4 were subjected to an adhesion test. A crosshatched cut pattern of the line was created Scotch® Magic Tape (3M) was applied to the surface of the patterned line. The tape was peeled off. The Example with the interlayer showed no removal of the conductive ink (good adhesion). For conductive ink lines without an interlayer, adhesion was poor with all Examples showing some removal of the conductive ink layer. With an interlayer, after removal of the tape, a thin layer of Ag was left adhering to the interlayer. The interlayer showed improved adhesion of Ag ink. Table 2 summarizes the results.

TABLE 2

Table 2: Adhesion Tape Test Results

| Substrate | Material Being Tested | Adhesion score (0-5) Scotch tape test | Notes |
|---|---|---|---|
| PET (Flex) | Interlayer | 5 | |
| PET (Flex) | Ag | 0-3 (average 1) | |
| PET (Flex) with interlayer | Ag | 0 | Conductive layer adheres to interlayer |
| Glass | Interlayer | 5 | |
| Glass | Ag | 0 | |
| Glass with interlayer | Ag | 0 | Conductive layer adheres to interlayer |
| PEN (Flex) | Interlayer | 5 | |
| PEN (Flex) | Ag | 3 | |
| PEN (Flex) with interlayer | Ag | 0-3 (average 1) | Conductive layer adheres to interlayer |
| PC (Flex) | Interlayer | 5 | |
| PC (Flex) | Ag | 0-2 (average 1.125) | |
| PC (rigid) | Interlayer | 5 | |
| PC (rigid) | Ag | 0 | |
| PC (rigid) with interlayer | Ag | 0-2 (average 1.125) | Conductive layer adheres to interlayer, but poor cohesion |

The interlayer provides a more uniform surface for the Ag lines, which resulted in more consistent lines.

Conductivity of the Ag lines was measured using a four point probe measurement.

It will be appreciated that variants of the above-disclosed and other features and functions or alternatives thereof may be combined into other different systems or applications. Various presently unforeseen or unanticipated alternatives, modifications, variations, or improvements therein may be subsequently made by those skilled in the art, which are also encompassed by the following claims.

What is claimed is:

1. A printing method comprising:
    depositing an interlayer composition comprising a polymer selected from the group consisting of: poly(propylene glycol) diglycidyl ether, propylene glycol methyl ether acetate, and poly(melamine co-formaldehyde), and an interlayer composition solvent on a substrate, wherein the substrate is selected from the group consisting of: glass, polylactic acid, acrylonitrile butadiene styrene (ABS), nylon, polyetherimide, acrylonitrile styrene acrylate, ceramic, polystyrene, polyacrylate and polymethacrylate;
    curing the interlayer composition to form a cured interlayer;
    depositing a conductive metal ink composition on the cured interlayer; and
    curing the conductive metal ink composition to form a solid metal trace on the cured interlayer.

2. The printing method according to claim 1, wherein the interlayer composition solvent is selected from the group consisting of: hydrocarbons, alcohols having from about 7 to about 18 carbon atoms, terpineol (α-terpineol), β-terpineol, geraniol, cineol, cedral, linalool, 4-terpineol, 3,7-dimethyl-octa-2,6-dien-1ol, 2-(2-propyl)-5-methyl-cyclohexane-1-ol, isoparaffinic hydrocarbons, isoparaffins, naphthenic oils, benzene, nitrobenzene, toluene, ortho-xylene, meta-xylene, para-xylene, 1,3,5-trimethylbenzene, 1,2-dichlorobenzene, 1,3-dichlorobenzene, 1,4-dichlorobenzene, trichlorobenzene; cyanobenzene; phenylcyclohexane, tetralin, isooctane, nonane, decane, dodecane, dicyclohexyl and decalin.

3. The printing method according to claim 1, wherein the conductive ink composition comprises silver nanoparticles and solvent.

4. The printing method according to claim 3, wherein the solvent is selected from the group consisting of: decalin, bicyclohexyl, ethylcyclohexane, phenylcyclohexane, tetralin, cyclohexane, n-octane, toluene, m-xylene, o-xylene, p-xylene, mesitylene, isopar, heptane, isooctane, and trimethylbenzene.

5. The printing method according to claim 1, wherein the interlayer composition includes a catalyst.

6. The printing method according to claim 1, wherein the interlayer composition includes a levelling agent.

7. The printing method according to claim 1, wherein the interlayer composition is deposited by aerosol printing.

8. The printing method according to claim 1, wherein the conductive ink composition is deposited by aerosol printing.

9. A printing method comprising:
    depositing an interlayer composition including a polymer selected from the group consisting of: poly(propylene glycol) diglycidyl ether, propylene glycol methyl ether acetate, and poly(melamine co-formaldehyde), and an interlayer composition solvent on a substrate, wherein the substrate is selected from the group consisting of: glass, polylactic acid, acrylonitrile butadiene styrene (ABS), nylon, polyetherimide, acrylonitrile styrene acrylate, ceramic, polystyrene, polyacrylate and polymethacrylate;

curing the interlayer composition to form a cured interlayer;

depositing a conductive metal ink composition on the cured interlayer, the conductive metal ink composition comprising silver nanoparticles having a size of from about 0.5 to about 100 nm; and curing the conductive metal ink composition to form a solid metal trace on the cured interlayer.

10. The printing method according to claim 9, wherein the interlayer composition solvent is selected from the group consisting of: decalin, bicyclohexyl, ethylcyclohexane, phenylcyclohexane, tetralin, cyclohexane, n-octane, toluene, m-xylene, o-xylene, p-xylene, mesitylene, isopar, heptane, isooctane, and trimethylbenzene.

11. The printing method according to claim 9, wherein the interlayer composition is cured at a temperature of from about 100° C. to about 180° C.

12. The printing method according to claim 9, wherein the conductive metal ink composition is cured at a temperature of from about 100° C. to about 180° C.

\* \* \* \* \*